(12) United States Patent
Yin et al.

(10) Patent No.: US 8,399,328 B2
(45) Date of Patent: Mar. 19, 2013

(54) TRANSISTOR AND METHOD FOR FORMING THE SAME

(75) Inventors: Haizhou Yin, Poughkeepsie, NY (US); Zhijong Luo, Poughkeepsie, NY (US); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/111,875

(22) Filed: May 19, 2011

(65) Prior Publication Data
US 2012/0104486 A1    May 3, 2012

Related U.S. Application Data

(63) Continuation of application No. PCT/CN2011/000280, filed on Feb. 23, 2011.

(30) Foreign Application Priority Data

Oct. 29, 2010   (CN) .......................... 2010 1 0532061

(51) Int. Cl.
*H01L 21/336*    (2006.01)
(52) U.S. Cl. ...................... 438/301; 257/327; 438/302

(58) Field of Classification Search .................. 257/335, 257/336, 345, 347, 349, 327; 438/166, 264, 438/276, 286, 302, 301
See application file for complete search history.

(56) References Cited

U.S. PATENT DOCUMENTS

2006/0081930 A1 * 4/2006 Maegawa et al. ............. 257/347
2010/0038685 A1   2/2010 Weber et al. .................. 257/288

* cited by examiner

*Primary Examiner* — Kimberly Rizkallah
*Assistant Examiner* — Errol Fernandes
(74) *Attorney, Agent, or Firm* — Martine Penilla Group, LLP (57) ABSTRACT

The present invention relates to a transistor and the method for forming the same. The transistor of the present invention comprises a semiconductor substrate; a gate dielectric layer formed on the semiconductor substrate; a gate formed on the gate dielectric layer; and a source region and a drain region located in the semiconductor substrate and on respective sides of the gate, wherein only the source region comprises at least one dislocation. The method for forming a transistor according to the present invention comprises forming a mask layer on a semiconductor substrate on which a gate has been formed so that the mask layer covers the gate and the semiconductor substrate; patterning the mask layer to only expose at least a portion of a source region; performing a first ion implantation to the exposed portion of the source region; and annealing the semiconductor substrate so as to form a dislocation in the exposed portion of the source region.

8 Claims, 9 Drawing Sheets

TRANSISTOR AND METHOD FOR FORMING THE SAME

CLAIM OF PRIORITY

This application claims priority under 35 U.S.C. §§120 and 365(c) as a continuation application of prior International Application No. PCT/CN2011/000280, filed Feb. 23, 2011, and which was not published in English under PCT Article 21(2). The PCT/CN2011/000280 application in turn claims priority to Chinese Application No. CN 201010532061.4, filed on Oct. 29, 2010. The disclosures of the prior international application and Chinese application are incorporated herein by reference.

FIELD OF THE INVENTION

The present invention relates to the field of semiconductor device manufacturing, and particularly, to a transistor and a method for forming the same.

BACKGROUND OF THE INVENTION

Typically, integrated circuits comprise a combination of N-type Metal Oxide Semiconductor (NMOS) and P-type Metal Oxide Semiconductor (PMOS) transistors formed on a substrate. The performance of an integrated circuit is directly related to the performance of transistors which it comprises. Therefore, it is desirable to improve the driving current of a transistor so as to enhance the performance thereof.

Figure 12A:
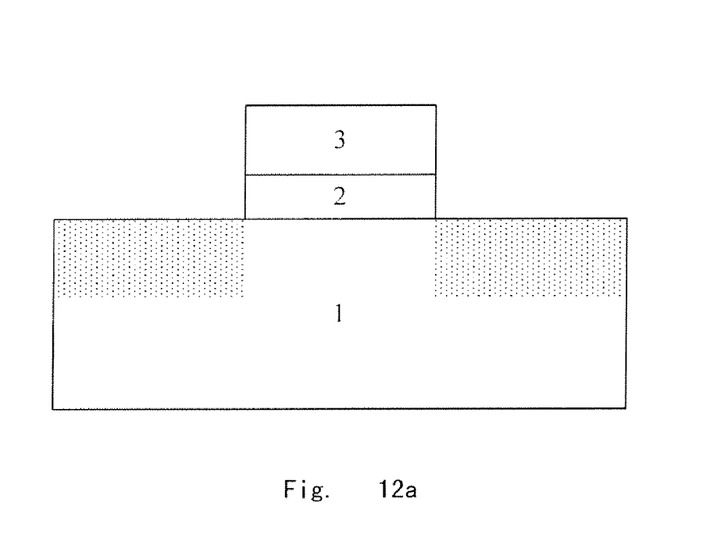
FIGS. 12a-c illustrate the formation of dislocations in the prior art.
Figure 12B:
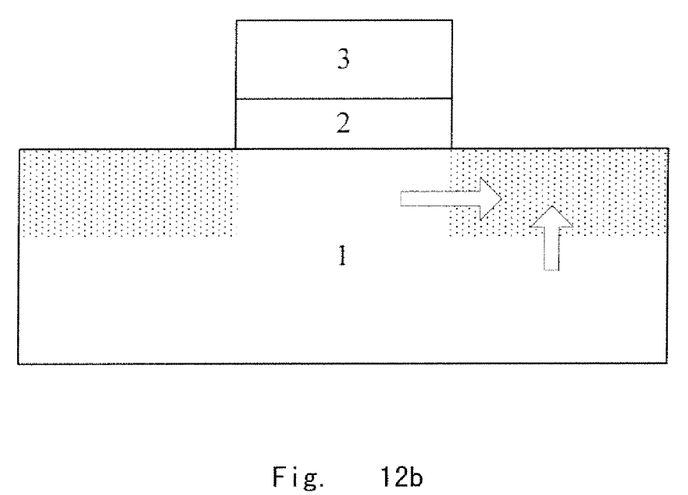
Figure 12C:
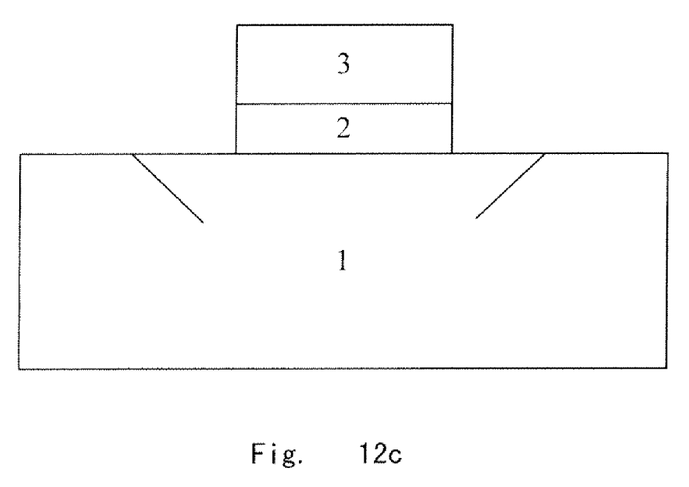

U.S. patent application Ser. No. 2010/0038685A1 discloses a transistor in which dislocations are formed between the channel region and the source/drain region. The dislocations may cause tensile stress, which may improve the electron mobility in the channel and thus increase the driving current in the transistor. FIGS. 12a-c in the present application show the formation of such dislocations. In FIG. 12a, silicon is implanted into a semiconductor substrate 1 on which a gate dielectric layer 2 and a gate 3 have been formed so as to form amorphous regions as indicated by the shaded portions in the figure. Then the semiconductor substrate 1 is annealed so as to re-crystallize the amorphous regions. As indicated by the arrows in FIG. 12b, the crystal growth front in the horizontal direction and the crystal growth front in the vertical direction meet during the process of the re-crystallization. As a result, dislocations are formed as shown in FIG. 12c.

However, if a dislocation is formed in the drain region, junction leakage will increase due to the voltage difference between the drain and the substrate.

SUMMARY OF THE INVENTION

An object of the present invention is to provide a transistor and a method for forming the same.

The method for forming a transistor according to the present invention comprises forming a mask layer on a semiconductor substrate on which a gate has been formed so that the mask layer covers the gate and the semiconductor substrate;

patterning the mask layer to only expose at least a portion of a source region;

performing a first ion implantation to the exposed portion of the source region; and annealing the semiconductor substrate so as to form a dislocation in the exposed portion of the source region.

The transistor according to the present invention comprises
a semiconductor substrate;
a gate dielectric layer formed on the semiconductor substrate;
a gate formed on the gate dielectric layer; and
a source region and a drain region located in the semiconductor substrate and on respective sides of the gate,
wherein only the source region comprises at least one dislocation.

According to the present invention, due to the fact that one or more dislocations are formed only in the source region, the junction leakage is less likely to increase while the electron mobility in the channel region can be increased.

Other aspects and advantages of the present invention will be detailed hereinafter in combination with the accompanying drawings.

DETAILED DESCRIPTION OF THE PREFERRED EMBODIMENTS

The preferred embodiments of the present invention will be detailed in the following in combination with the accompanying drawings. The drawings are drawn schematically and not to scale for the purpose of illustrating the embodiments of the present invention rather than limiting the protection scope thereof. The same reference numbers are used to indicate same or similar components throughout the drawings. Processes and device structures which are well known in the art are omitted here in order to make the technical solutions of the present invention clearer.

<The First Embodiment>

Figure 1:
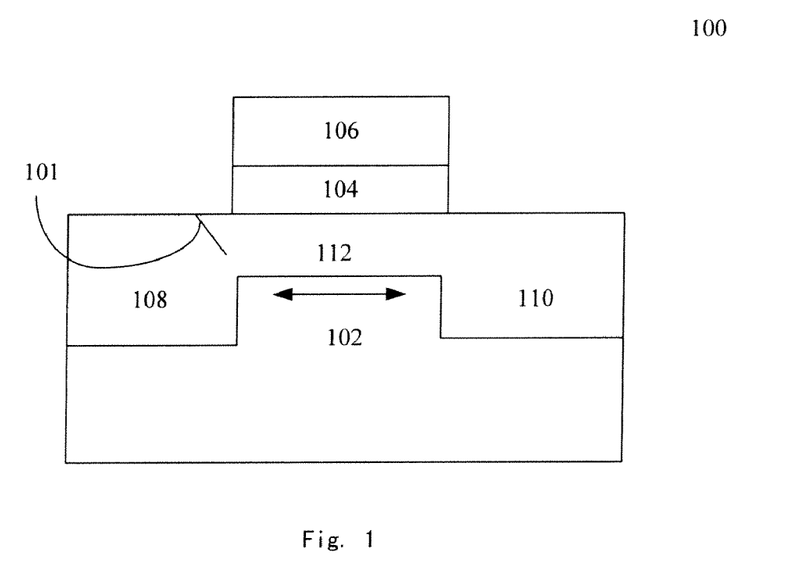
FIG. 1 schematically illustrates a transistor according to a first embodiment of the present invention.

FIG. 1 schematically illustrates a transistor according to the first embodiment of the present invention. As shown in FIG. 1, a transistor 100 comprises a semiconductor substrate 102, a gate dielectric layer 104 formed on the semiconductor substrate 102, a gate 106 formed on the gate dielectric layer 104, a source region 108 and a drain region 110 in the semiconductor substrate 102 and on respective sides of the gate 106, and a channel region 112 under the gate dielectric layer 104 and between the source region 108 and the drain region 110. In the transistor 100 shown in FIG. 1, the source region 108 comprises a dislocation 101 adjacent to the channel region 112. The dislocation 101 applies tensile stress (as indicated by the arrow in the figure) to the channel region 112, which increases the electron mobility in the channel region.

In addition, the transistor 100 further comprises sidewall spacers formed on the side surfaces of the gate dielectric layer 104 and the gate 106, as well as source and drain contacts, etc., which are well known structures in the art and are thus neither shown in the drawings nor described in detail.

The method for forming the transistor in accordance with the first embodiment will be described hereinafter with reference to FIGS. 2a-c.

Figure 2A:
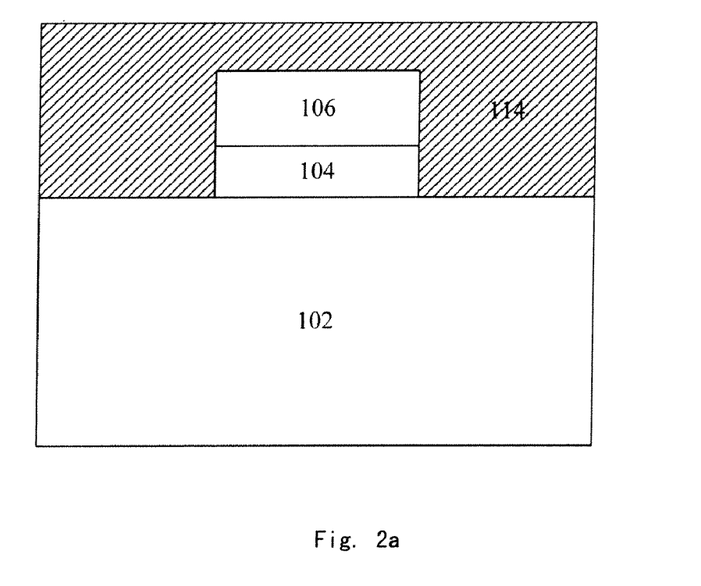
FIGS. 2a-c schematically illustrate the steps of the method for forming the transistor according to the first embodiment of the present invention.

As shown in FIG. 2a, a mask layer 114 is formed on a semiconductor substrate 102 on which a gate dielectric layer 104 and a gate 106 have been formed, so that the mask layer 114 covers the gate 106 and the semiconductor substrate 102. The mask layer 114 can be formed of photoresist, or can be a hard mask layer formed of a dielectric material such as silicon oxide and/or silicon nitride. Although the mask layer 114 is formed to cover the gate 106 in FIG. 1, the present invention is not limited thereto. The mask layer 114 can be formed to be flushed with or lower than the gate 106.

Figure 2B:
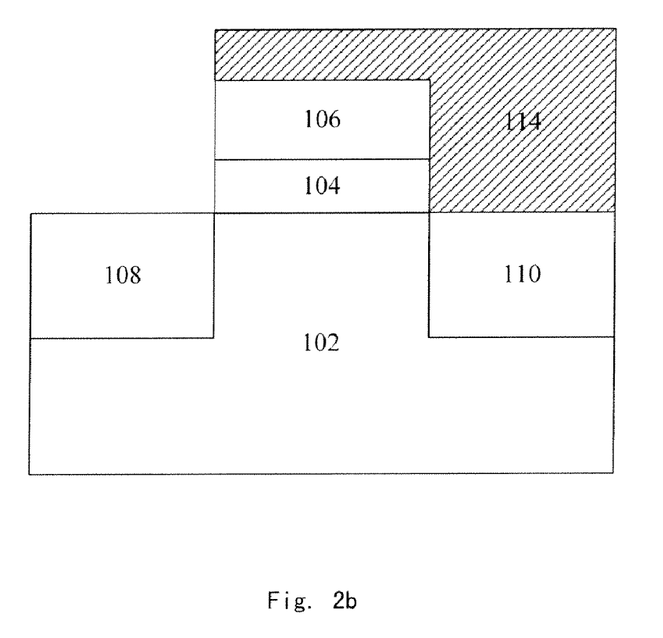
Figure 2C:
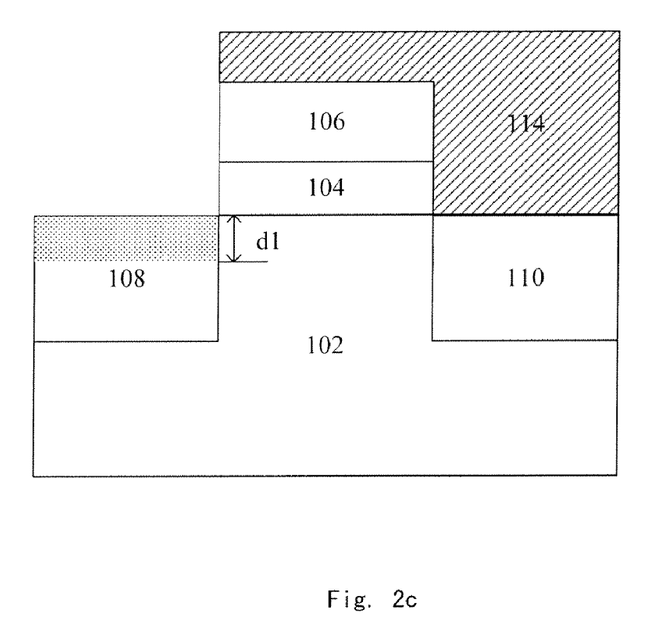

Next, as shown in FIG. 2b, the mask layer 114 is patterned so that only the source region 108 is exposed. Afterwards, as shown in FIG. 2c, a first ion implantation with a first implantation depth of d1 is performed in the source region 108 so that an amorphous region is formed as shown by the shaded portion of FIG. 2c. After the step shown in FIG. 2c, the mask layer 114 is removed and an annealing is performed so that the amorphous region is re-crystallized. During the process of the re-crystallization, different crystal growth fronts meet and thus the dislocation 101 is formed in the source region 108. As a result, the device shown in FIG. 1 is obtained. Alternatively, in the case where the mask layer 114 is a hard mask layer, it can be removed after the annealing.

According to the present embodiment, due to the fact that the dislocation is formed only in the source region, the junction leakage is less likely to increase while the electron mobility in the channel region can be increased.

<The Second Embodiment>

Figure 3:
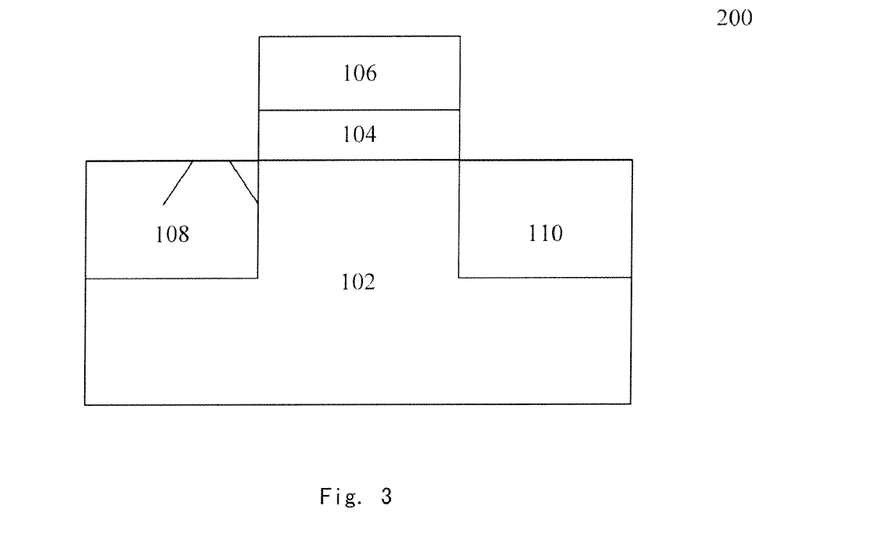
FIG. 3 schematically illustrates a transistor according to a second embodiment of the present invention.

FIG. 3 schematically shows a transistor according to the second embodiment of the present invention. The transistor 200 shown in FIG. 3 is different from the transistor 100 shown in FIG. 1 in that there are two dislocations in the source region 108 in the direction parallel to a top surface of the substrate 102. Although the dislocations are shown not to intersect each other in FIG. 3, the dislocations may intersect each other.

Figure 4A:
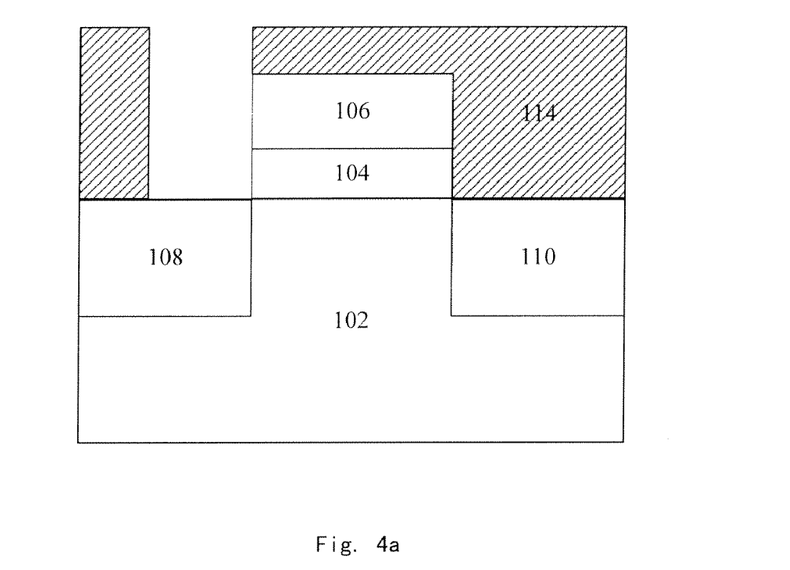
FIGS. 4a-b schematically illustrate the steps of the method for forming the transistor according to the second embodiment of the present invention.

The method for forming the transistor 200 is similar to that for forming the transistor 100. First, a mask layer 114 is formed on a semiconductor substrate 102 on which a gate dielectric layer 104 and a gate 106 have been formed, so that the mask layer 114 covers the gate 106 and the semiconductor substrate 102, which is the same as the step shown in FIG. 2a of the first embodiment and thus is not shown here. Next, the mask layer 114 is patterned so that only a portion of the source region 108 is exposed, as shown in FIG. 4a. Preferably, the portion adjacent to the gate is exposed so that the dislocation formed subsequently is closer to the channel region.

Figure 4B:
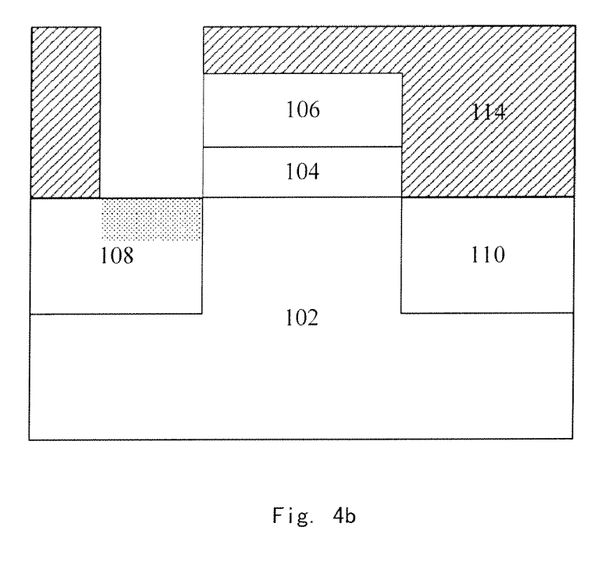

Then, as shown in FIG. 4b, an ion implantation is performed to the exposed portion of the source region 108 so that an amorphous region is formed in the source region, as shown by the shaded portion of the FIG. 4b. Finally, the mask layer 114 is removed, and an annealing is performed to the structure formed as shown in FIG. 4b. As a result, two dislocations are formed in the source region 108, and the device shown in FIG. 3 is obtained. Alternatively, in the case where the mask layer 114 is a hard mask layer, it may be removed after the annealing.

Figure 5A:
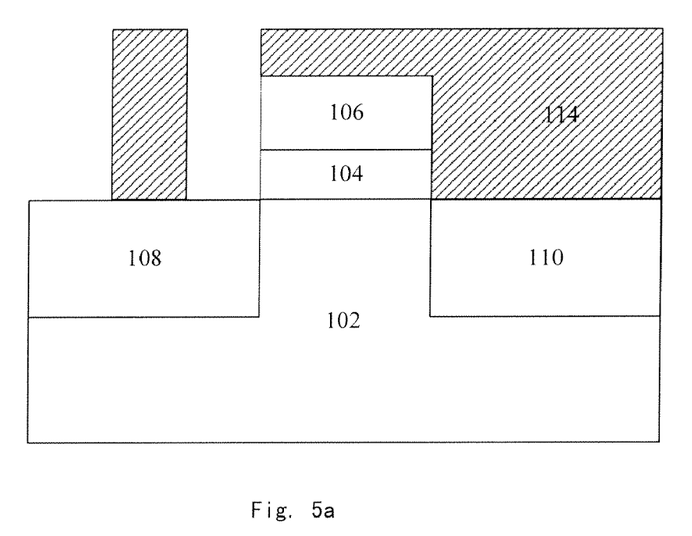
FIGS. 5a-b schematically illustrate the steps of the method for forming the transistor according to a variation of the second embodiment of the present invention.
Figure 5B:
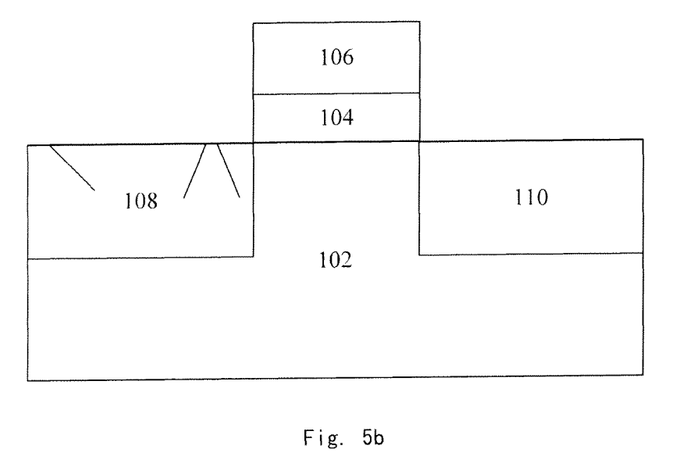

Although two dislocations are shown in FIG. 3, the present invention is not limited thereto, and the number of the dislocation may be three or more. It will be appreciated by those skilled in the art that according to the principle of the present invention, more than one portion of the source region 108 may be exposed in the step of patterning the mask layer when a device including three or more dislocations is to be formed. In this case, parts of the mask layer 114 which are between the adjacent exposed portions are not removed, and the portion of the source region 108 that is adjacent to the gate is preferably exposed. As a non-limiting example, FIG. 5a shows that two portions of the source region 108 are exposed, and FIG. 5b shows that the source region 108 of the transistor obtained from the step shown in FIG. 5a comprises three dislocations.

According to the present embodiment, since more dislocations are formed in the source region, tensile stress applied to the channel region are further increased, and accordingly it is possible for the electron mobility in the channel region to be further increased, while the junction leakage is less likely to increase due to the fact that no dislocation is formed in the drain region 110.

<The Third Embodiment>

Figure 6:
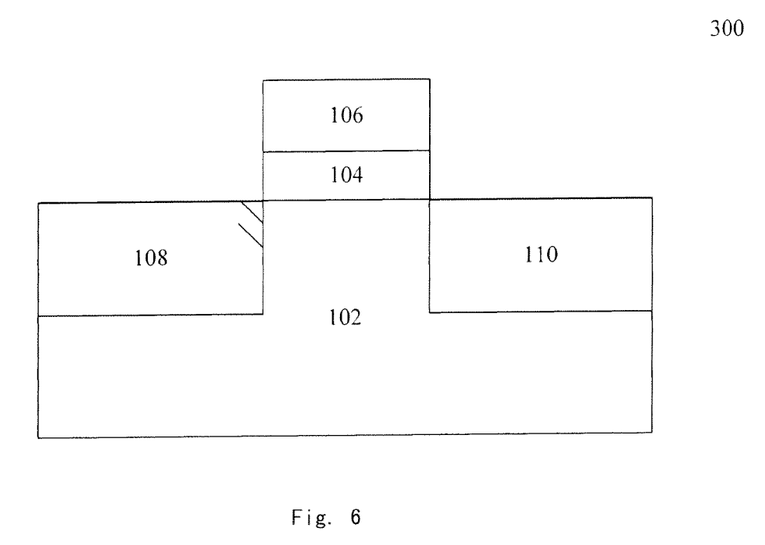
FIG. 6 schematically illustrates a transistor according to a third embodiment of the present invention.

FIG. 6 shows the transistor according to the third embodiment of the present invention. The transistor 300 shown in FIG. 6 is different from the transistor 100 shown in FIG. 1 in that the source region 108 comprises a set of two dislocations which are adjacent to the channel region 112 and arranged in the direction perpendicular to the top surface of the semiconductor substrate 102.

Figure 7:
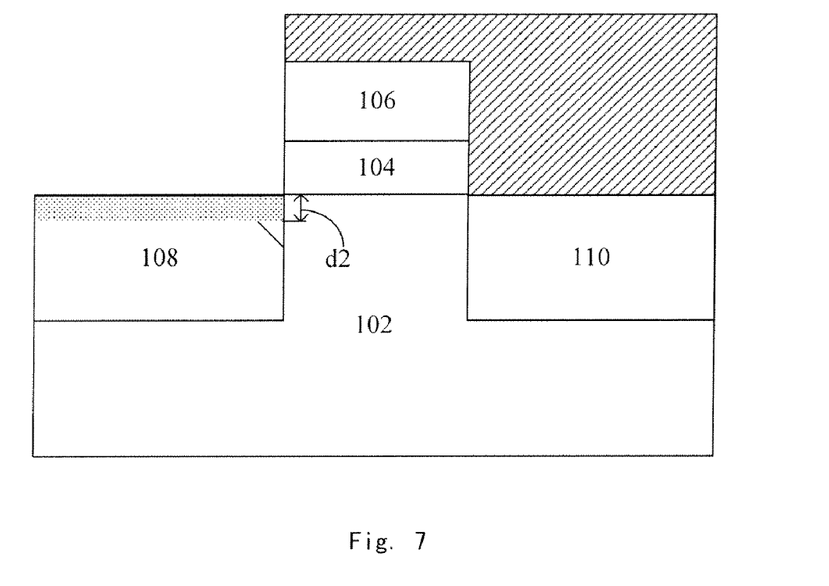
FIG. 7 schematically illustrates one of the steps of the method for forming the transistor according to the third embodiment of the present invention.

Accordingly, as compared with the method for forming the transistor 100 in the first embodiment, the method for forming the transistor 300 according to the present embodiment further comprises performing a second ion implantation with a second implantation depth of d2 to the source region 108 after the annealing step of the method of the first embodiment, with the second implantation depth d2 being smaller than the first implantation depth d1, as shown in FIG. 7. An annealing is performed after the second ion implantation and the device shown in FIG. 6 is obtained. The implantation depth may be controlled by adjusting the energy and dose of the ion implantation. In the present embodiment, the mask layer 114 is preferably a hard mask layer so that the annealing after the first ion implantation may be performed without removing the mask layer 114.

Although FIG. 6 shows that the source region 108 comprises a set of two dislocations, the present invention is not limited thereto. The source region 108 may comprise a set of more than two dislocations which are adjacent to the channel region 112 and arranged in the direction perpendicular to the top surface of the semiconductor substrate 102. Accordingly, the more dislocations are formed by performing more ion implantations with different implantation depths, in which case the implantation depth of a later ion implantation is smaller than that of a former one.

According to the present embodiment, in the source region 108, more dislocations may be formed adjacent to the channel region as required, thus, tensile stress applied to the channel region are further increased, and accordingly it is possible for the electron mobility in the channel region to be further increased, while the junction leakage is less likely to increase due to the fact that no dislocation is formed in the drain region 110.

<The Fourth Embodiment>

The fourth embodiment is a combination of the second embodiment and the third embodiment. The method for forming a transistor according to the present embodiment may selectively form a mask layer 114 on the drain region 110 and the source region 108 so as to completely cover the drain region 110 while covering a portion or at least two portions of the source region 108 before performing one or more of the ion implantations. In the case that the mask layer 114 covers at least two portions of the source region 108, parts of the source region 108 between adjacent covered portions of the source region 108 are exposed. In one preferred embodiment, a portion of the source region 108 that is adjacent to the gate 106 is at least exposed. The selective formation of the mask layer may be achieved by the photolithography process that is well known in the art.

In the case that mask layers are selectively formed before more than one ion implantations, the patterns of the mask layers formed at one time may be the same or vary from one mask layer to another. In one preferred embodiment, the mask layer is formed of a dielectric material such as silicon oxide and/or silicon nitride, and thus there is no need to remove the mask layer during the process of annealing in the case where the patterns of the mask layers are the same. As a result, by performing the step of selectively forming the mask layer only once, a plurality of dislocations may be formed in the direction perpendicular to the top surface of the substrate through multiple implantation-annealing procedures while a plurality of dislocations are formed in the direction parallel to the top surface of the substrate.

Figure 8:
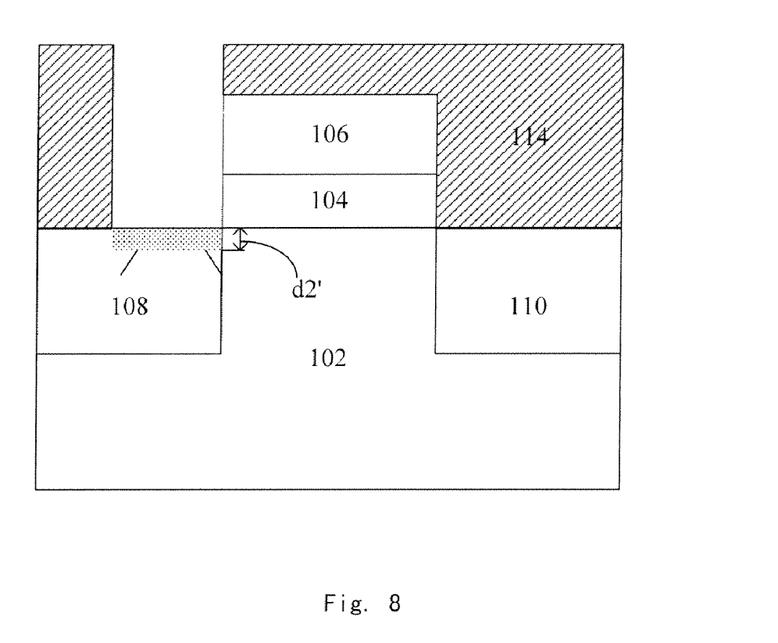
FIG. 8 schematically illustrates one of the steps of the method for forming a transistor according to an example of the fourth embodiment of the present invention.
Figure 9:
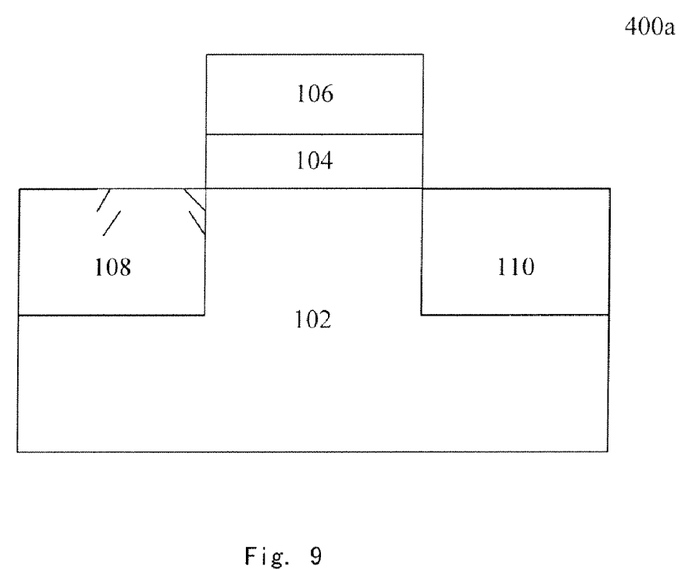
FIG. 9 schematically illustrates the transistor according to the example of the fourth embodiment of the present invention.

In a non-limiting example, a second ion implantation with an implantation depth of d2' smaller than the first implantation depth d1 is performed after forming the structure shown in FIG. 3 in the second embodiment, and a structure shown in FIG. 8 is obtained. An annealing is performed after the second ion implantation and the transistor 400a shown in FIG. 9 is obtained. It is preferable to use a hard mask layer as the mask layer 114 in this example, so that there is no need to remove the mask layer 114 during the annealing performed for forming the device structure shown in FIG. 3, and the mask layer 114 still remains when the second ion implantation is performed.

Figure 10:
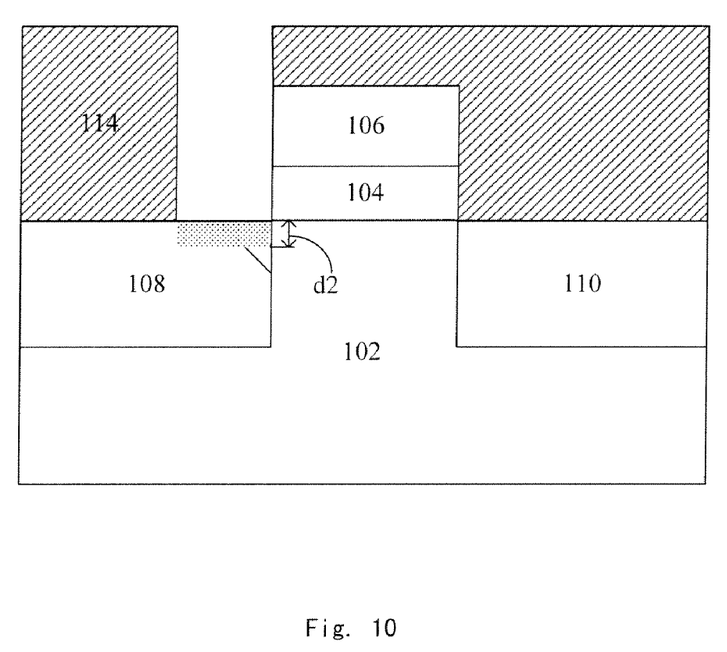
FIG. 10 schematically illustrates one of the steps of the method for forming a transistor according to another example of the fourth embodiment of the present invention.
Figure 11:
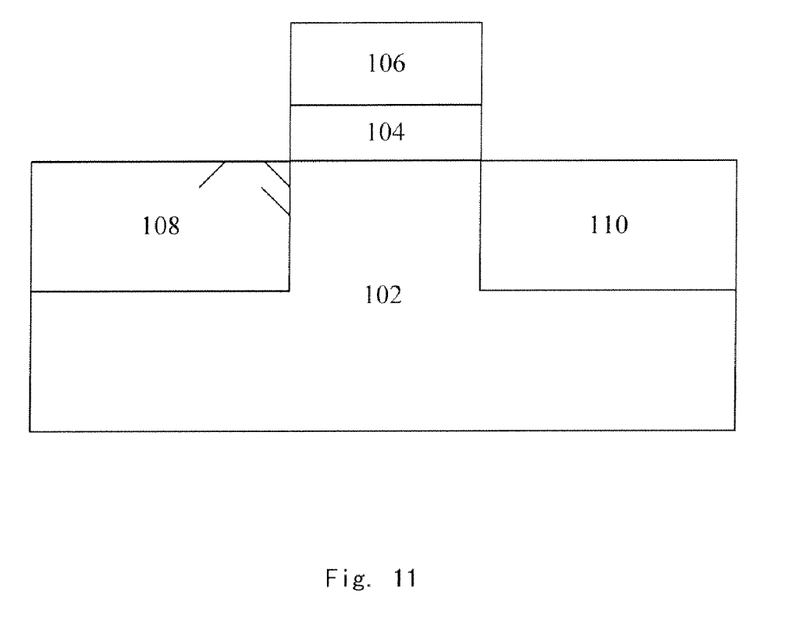
FIG. 11 schematically illustrates the transistor according to a further example of the fourth embodiment of the present invention.

In another non-limiting example, in addition to the steps of the third embodiment, the mask layer 114 is formed before the second ion implantation so that a portion of the source region 108 is covered by the mask layer 114 while the drain region 110 is completely covered by the mask layer 114. FIG. 10 shows the structure obtained after the second ion implantation subsequent to the formation of the mask layer 114, in which structure no ion implantation is performed to the portion of the source region 108 that is covered by the mask layer 114. The structure shown in FIG. 10 is annealed and the transistor 400b shown in FIG. 11 is obtained. The mask layer 114 may be removed before or after the annealing as required.

Therefore, the transistor of the present embodiment comprises at least a further dislocation in the source region that is farther from the channel region than the dislocations formed in the third embodiment.

The direction that is parallel to the top surface of the substrate is defined as the horizontal direction of the transistor, and the direction that is perpendicular to the top surface of the substrate is defined as the vertical direction of the transistor.

As compared with the first, second and third embodiments, the fourth embodiment obtains more dislocations in the source region in both of the horizontal and the vertical directions of the transistor, which makes it possible for the tensile stress applied to the channel region (and thus the electron mobility of the channel region) to be further increased. Meanwhile, due to the fact that the dislocations are formed only in the source region, the junction leakage is less likely to increase while the electron mobility in the channel region may be increased.

The transistors in accordance with the first to fourth embodiments may be NMOS transistors.

In the methods for forming the transistors in accordance with the first to fourth embodiments, the semiconductor substrate may comprise an NMOS device region and a PMOS device region, and the methods for forming the transistors in accordance with the present invention are performed only to the NMOS device region.

In the first to fourth embodiments, the transistors may also comprise a semiconductor layer (not shown), for example, a layer of Si, SiC, SiGe or Ge, on the source region 108, which makes the dislocations not to be exposed to a free surface so as to prevent decrease of the tensile stress due to exposure of dislocations to a free surface.

In the first to fourth embodiments, the ions implanted in the ion implantations may be one of Si, Ge, P, B and As, or any combination thereof.

In the first to fourth embodiments, the annealing temperature may be greater than 400° C., preferably 500° C.-900° C., and the annealing time may be in the range of several seconds to several minutes.

The formation of the sidewall spacer and the source/drain contact and so on which are well known in the art may be performed after the steps of method described in the first to fourth embodiments so as to form a complete device.

Although in the above descriptions, the doping processes for forming the source and the drain are performed after the formation of the dislocations, the present invention is not limited thereto and the dislocations may be formed in any suitable phase. For example, the dislocations may be formed after the doping of the source and the drain.

Furthermore, the semiconductor substrate mentioned above may be a silicon substrate, a SiGe substrate, a SiC substrate or a III-V semiconductor (for example, GaAs, GaN, etc.) substrate. The gate dielectric layer may use one of $SiO_2$, $HfO_2$, HfSiO, HfSiON, HfTaO, HfTiO, HfZrO, $Al_2O_3$, $La_2O_3$, $ZrO_2$ and LaAlO, or any combination thereof, and the material of the gate may be selected from a group comprising Poly-Si, Ti, Co, Ni, Al, W, the alloy thereof and the silicide thereof.

The transistor and the method for forming the same according to the present invention are described by way of exemplary embodiments hereinbefore. However, the scope of the present invention does not intend to be limited thereto. Any modifications or variations of the above embodiments that can be contemplated by one skilled in the art will fall within the scope of the present invention defined by the appended claims.

What is claimed is:

1. A method for forming a transistor, comprising:
    forming a mask layer on a semiconductor substrate on which a gate has been formed so that the mask layer covers the gate and the semiconductor substrate;
    patterning the mask layer to only expose at least a portion of a source region;
    performing a first ion implantation to the exposed portion of the source region; and annealing the semiconductor substrate to form a dislocation in the exposed portion of the source region, so as to apply a tensile stress to the channel, wherein the step of patterning the mask layer to only expose at least a portion of a source region comprises exposing at least two portions of the source region with parts of the mask layer between adjacent ones of the exposed portions remaining.

2. The method according to claim 1, wherein the step of patterning the mask layer to only expose at least a portion of a source region comprises exposing at least a portion of the source region that is adjacent to the gate.

3. The method according to claim 1, wherein at least one further ion implantation with an implantation depth smaller than that of the first ion implantation is performed after the step of annealing, and the implantation depth of a later ion implantation is smaller than that of a former one in the case that more than one further ion implantations are performed; and an annealing is performed after each of the at least one further ion implantation so that a dislocation is formed in the source region.

4. The method according to claim 3, wherein before one or more of the at least one further ion implantations, a mask layer is selectively formed on the source region to cover one or a plurality of portions of the source region, and wherein no mask layer exists between adjacent ones of the plurality of portions so that ions are only implanted into the portions of the source region which are not covered by the mask layer.

5. The method according to claim 1, wherein the semiconductor substrate comprises an NMOS device region and a PMOS device region, and the method is performed only to the NMOS device region.

6. The method according to claim 1, wherein the dislocation applies tensile stress to a channel region between the source region and the drain region so that the electron mobility of the channel region is increased.

7. The method according to claim 1, further comprising forming a semiconductor layer on the source region so that the dislocation is not exposed to a free surface.

8. The method according to claim 1, wherein the semiconductor substrate is a Si substrate, a SiGe substrate, a SiC substrate, a GaAs substrate or a GaN substrate.

* * * * *